United States Patent
Andrews

(10) Patent No.: US 7,365,371 B2
(45) Date of Patent: Apr. 29, 2008

(54) PACKAGES FOR SEMICONDUCTOR LIGHT EMITTING DEVICES UTILIZING DISPENSED ENCAPSULANTS

(75) Inventor: Peter Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 114 days.

(21) Appl. No.: 11/197,096

(22) Filed: Aug. 4, 2005

(65) Prior Publication Data

US 2007/0029569 A1    Feb. 8, 2007

(51) Int. Cl.
  H01L 29/22    (2006.01)
  H01L 33/00    (2006.01)
  H01L 29/227   (2006.01)
  H01L 29/24    (2006.01)
  H01L 23/02    (2006.01)

(52) U.S. Cl. .......................... 257/99; 257/100; 257/98; 257/678

(58) Field of Classification Search .................. 257/99, 257/678, 690, 98, 100
See application file for complete search history.

(56) References Cited

U.S. PATENT DOCUMENTS

| | | | |
|---|---|---|---|
| 4,918,497 A | 4/1990 | Edmond | 357/17 |
| 4,966,862 A | 10/1990 | Edmond | 437/100 |
| 5,027,168 A | 6/1991 | Edmond | 357/17 |
| 5,119,174 A | 6/1992 | Chen | 357/80 |
| 5,210,051 A | 5/1993 | Carter, Jr. | 437/107 |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,773,882 A * | 6/1998 | Iwasaki | 257/692 |
| 5,912,477 A | 6/1999 | Negley | 257/95 |
| 6,120,600 A | 9/2000 | Edmond et al. | 117/89 |

(Continued)

FOREIGN PATENT DOCUMENTS

EP    1 246 266    10/2002

OTHER PUBLICATIONS

International Search Report and Written Opinion of the International Searching Authority for Application No. PCT/US2005/033057 mailed on Jun. 13, 2006.

Primary Examiner—Richard T. Elms
Assistant Examiner—Allison P Bernstein
(74) Attorney, Agent, or Firm—Myers Bigel Sibley & Sajovec

(57) ABSTRACT

A submount for mounting an LED chip includes a substrate, a die attach pad configured to receive an LED chip on an upper surface of the substrate, a first meniscus control feature on the substrate surrounding the die attach pad and defining a first encapsulant region of the upper surface of the substrate, and a second meniscus control feature on the substrate surrounding the first encapsulant region and defining a second encapsulant region of the upper surface of the substrate. The first and second meniscus control features may be substantially coplanar with the die attach pad. A packaged LED includes a submount as described above and further includes an LED chip on the die attach pad, a first encapsulant on the substrate within the first encapsulant region, and a second encapsulant on the substrate within the second encapsulant region and covering the first encapsulant.

19 Claims, 12 Drawing Sheets

U.S. PATENT DOCUMENTS

| | | |
|---|---|---|
| 6,187,606 B1 | 2/2001 | Edmond et al. ............... 438/46 |
| 6,201,262 B1 | 3/2001 | Edmond et al. ............... 257/77 |
| 6,610,563 B1 | 8/2003 | Waitl et al. |
| 6,730,933 B1 | 5/2004 | Shimizu et al. |
| 2002/0123164 A1 | 9/2002 | Slater, Jr. et al. ............. 438/39 |
| 2003/0006418 A1 | 1/2003 | Emerson et al. ............... 257/79 |
| 2004/0056260 A1 | 3/2004 | Slater, Jr. et al. ............. 257/79 |
| 2004/0065894 A1* | 4/2004 | Hashimoto et al. ......... 257/100 |
| 2004/0256706 A1* | 12/2004 | Nakashima ................. 257/678 |
| 2005/0221518 A1* | 10/2005 | Andrews et al. ............. 438/27 |

* cited by examiner

PACKAGES FOR SEMICONDUCTOR LIGHT EMITTING DEVICES UTILIZING DISPENSED ENCAPSULANTS

FIELD OF THE INVENTION

This invention relates to semiconductor light emitting devices and methods of fabricating semiconductor light emitting devices, and more particularly to packaging and packaging methods for semiconductor light emitting devices.

BACKGROUND

Light emitting diodes and laser diodes are well known solid state electronic devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer).

In order to use an LED in a circuit, it is known to enclose an LED in a package to provide environmental and/or mechanical protection, color selection, focusing and the like. An LED package also includes means, such as electrical leads or traces, for electrically connecting the LED chip to an external circuit. In a typical package 10 illustrated in FIG. 1A, an LED 12 is mounted on a reflective cup 13 by means of a solder bond or conductive epoxy. One or more wirebonds connect the ohmic contacts of the LED 12 to leads 15A, 15B, which may be attached to or integral with the reflective cup 13. The reflective cup may be filled with an encapsulant material 16 containing a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup may direct light in an upward direction, optical losses may occur when the light is reflected (i.e. some light may be absorbed by the reflector cup instead of being reflected).

In another conventional package 20 illustrated in FIG. 1B, a plurality of LED chips 22 are mounted onto a printed circuit board (PCB) carrier 23. One or more wirebond connections are made between ohmic contacts on the LEDs 22 and electrical traces 25A, 25B on the PCB 23. Each mounted LED 22 is then covered with a drop of clear resin 24, which may provide environmental and mechanical protection to the chips while also acting as a lens. The individual packaged LEDs 22 may then be separated by sawing the PCB carrier 23 into small squares, each of which contains one or more LED chips 22.

SUMMARY

Embodiments of the invention provide a submount for mounting an LED including a substrate having an upper surface, a die attach pad configured to receive an LED chip on the upper surface of the substrate. A first meniscus control feature on the substrate surrounds the die attach pad defines a first encapsulant region of the upper surface of the substrate. A second meniscus control feature on the substrate surrounds the first encapsulant region and defines a second encapsulant region of the upper surface of the substrate. In some embodiments, the first and second meniscus control features are substantially coplanar with the die attach pad.

In other embodiments, the substrate is a printed circuit board (PCB). The die attach pad and the first and second meniscus control features may be formed as metal traces on the substrate. In some embodiments, the meniscus control features may include a material different than the die attach pad. For example, the meniscus control features may include a polymer such as a solder mask material and/or polyimide. In some embodiments, the die attach pad and the first and second meniscus control features include the same material. Further, the first and/or second meniscus control features may include a plated copper or other metal film formed directly on the substrate. The first and/or second meniscus control feature may include a corner of a patterned feature on the substrate. Further, the die attach pad may include a metal stack on the metal trace.

In further embodiments of the invention, a wirebond pad on the substrate is disposed within the second encapsulant region. The wirebond pad may be disposed within the first encapsulant region. The substrate may include a lower surface opposite the upper surface of the substrate, and the submount may further include all electrode on the lower surface of the substrate. A conductive via may extend through the substrate from the electrode to the die attach pad. Further, a conductive via may extend through the substrate from the electrode to the wirebond pad.

In other embodiments, an electrode may be on the upper surface of the substrate. The electrode may be formed of the same material as the first and second meniscus control features. Further, a conductive via may extend through the substrate from the lower electrode to the electrode on the upper surface of the substrate.

In yet further embodiments, the submount may also include a third meniscus control feature disposed within the first encapsulant region and surrounding the die attach pad. The third meniscus control feature may define a third encapsulant region within the first encapsulant region. The first meniscus control feature and the third meniscus control feature may together define a region in the first encapsulant region surrounding the third encapsulant region. The region of the first encapsulant region defined by the first meniscus control feature and the third meniscus control feature may be ring-shaped.

In other embodiments, the submount may include at least one surface feature on the substrate between the first meniscus control feature and the second meniscus control feature. The submount may include a one or more surface features on the substrate between the first meniscus control feature and the second meniscus control feature, wherein a path extending in a radial direction from the first meniscus control feature to the second meniscus control feature is interrupted by at least one surface feature. The surface feature(s) may be continuous or discontinuous and may be formed of the same material as the first and second meniscus control features. For example, the surface feature(s) may include a metal film such as a plated copper film. In some embodiments, the surface feature(s) may include a material different than the die attach pad. For example, the surface feature(s) may include a polymer such as a solder mask material and/or polyimide.

In yet other embodiments, a submount for mounting an LED includes a substrate having an upper surface and a conductive pattern on the upper surface of the substrate. The conductive pattern includes a portion configured to receive an LED chip. A first meniscus control feature on the substrate surrounds the submount and defines a first encapsulant region of the upper surface of the substrate. A second meniscus control feature on the substrate surrounds the first encapsulant region and defines a second encapsulant region of the upper surface of the substrate.

The conductive pattern may include a conductive trace directly on the substrate, and may further include a wirebond pad disposed within the second encapsulant region. The wirebond pad may be disposed within the first encapsulant region. The conductive pattern may additionally include an electrode disposed outside the second encapsulant region.

In some embodiments, a packaged LED includes a submount as described above and further includes an LED chip on the die attach pad, a first encapsulant on the substrate within the first encapsulant region, and a second encapsulant on the substrate within the second encapsulant region and covering the first encapsulant.

A packaged LED according to some embodiments of the invention may further include a wirebond connection between the LED chip and the wirebond pad. In addition, a packaged LED may further include an electrostatic discharge (ESD) protection chip on the die attach pad. The first and/or second encapsulant may include a silicone gel and/or an epoxy resin. In addition, the first and/or encapsulant may include a wavelength conversion material such as, for example, a phosphor and/or a nanocrystal.

In some embodiments a packaged LED includes a submount as described above, and further includes an LED chip on the die attach pad. A first encapsulant is provided on the substrate within the region of the first encapsulant region defined by the first meniscus control feature and the second meniscus control feature. A second encapsulant is provided on the substrate within the third encapsulant region. A third encapsulant is provided on the substrate within the second encapsulant region covering the first encapsulant and the second encapsulant.

In yet other embodiments, methods of forming LED submounts and packaged LEDs are provided including depositing a metal layer on a substrate and patterning the metal layer to form a die attach pad, a first meniscus control feature that surrounds the die attach pad and defines a first encapsulant region of the upper surface of the substrate, and a second meniscus control feature that surrounds the first encapsulant region and defines a second encapsulant region of the upper surface of the substrate.

Some methods of forming a packaged LED include depositing a metal layer on a substrate and patterning the metal layer to form a die attach pad, a first meniscus control feature, and a second meniscus control feature. The first meniscus control feature may surround the die attach pad and define a first encapsulant region of the upper surface of the substrate. The second meniscus control feature may surround the first encapsulant region and define a second encapsulant region of the upper surface of the substrate.

Other methods according to the invention further include mounting an LED chip on the die attach pad on the substrate. A first encapsulant material may be dispensed onto the substrate and the mounted LED chip within the first encapsulant region, and the first encapsulant material may be cured. After curing the first encapsulant material, a second encapsulant material may be dispensed onto the substrate within the second encapsulant region, and the second encapsulant material may be cured. A quantity of encapsulant material may be pre-dispensed adjacent the LED chip prior to dispensing the first encapsulant material. In some embodiments, a sufficient quantity of the first encapsulant material may be dispensed to substantially cover the LED chip.

In some embodiments, patterning the metal layer includes patterning the metal layer to form a wirebond pad within the second encapsulant region. The method may further include forming a wirebond connection between the LED chip and the wirebond pad.

In some embodiments, the first encapsulant material includes a wavelength conversion material, such as a phosphor and/or a nanocrystal. Patterning the metal layer may further include forming at least one surface feature between the first and second meniscus control features. The surface features may help the encapsulant material adhere to the surface of the substrate and/or cling to the meniscus control features.

Methods of forming a packaged LED according to further embodiments of the invention include depositing a metal layer on a substrate and patterning the metal layer to form a die attach pad, a first meniscus control feature, a second meniscus control feature and a third meniscus control feature. The first meniscus control feature may surround the die attach pad and define a first encapsulant region of the upper surface of the substrate. The second meniscus control feature may surround the first encapsulant region and define a second encapsulant region of the upper surface of the substrate. The third meniscus control feature may be formed within the first encapsulant region and may surround the die attach pad to thereby define a third encapsulant region within the first encapsulant region. The first meniscus control feature and the third meniscus control feature may together define a region in the first encapsulant region surrounding the third encapsulant region. The first encapsulant material may be dispensed in a shape corresponding to a shape of the region surrounding the third encapsulant region. For example, in some embodiments of the invention, the shape of the region surrounding the third encapsulant region is annular, and the first encapsulant material may be dispensed by moving a dispensing needle in a circular motion.

In other embodiments, an LED chip is mounted on the die attach pad and a first encapsulant material is dispensed within the region in the first encapsulant region defined by the first meniscus control feature and the third meniscus control feature. The first encapsulant material may then be cured and a second encapsulant material may be dispensed onto the substrate within the third encapsulant region. The second encapsulant material may then be cured. A third encapsulant material may be dispensed within the second encapsulant region, and the third encapsulant material may be cured. The dispensed first encapsulant material may define a cavity around the LED chip, and dispensing the second encapsulant material may include dispensing the second encapsulant material into the cavity around the LED chip after curing the first encapsulant material. The first encapsulant material, the second encapsulant material and/or the third encapsulant material may include a wavelength conversion material.

In further methods, a meniscus extension feature may be formed outside the second encapsulant region. The meniscus extension feature may surround the second encapsulant region and define a encapsulant extension area of the upper surface of the substrate. A fourth encapsulant material may be dispensed in the encapsulant extension area after curing the second encapsulant material and curing the fourth encapsulant material. The encapsulant extension area may have a peripheral shape that is different from a peripheral shape of the second encapsulant region. For example, the encapsulant extension area may have a peripheral shape that is oval, circular, rectangular and/or generally square. In some embodiments, the meniscus extension features may include a material different than the die attach pad. For example, the meniscus control features may include a polymer such as a solder mask material and/or polyimide.

DETAILED DESCRIPTION OF EMBODIMENTS OF THE INVENTION

Figure 1A:
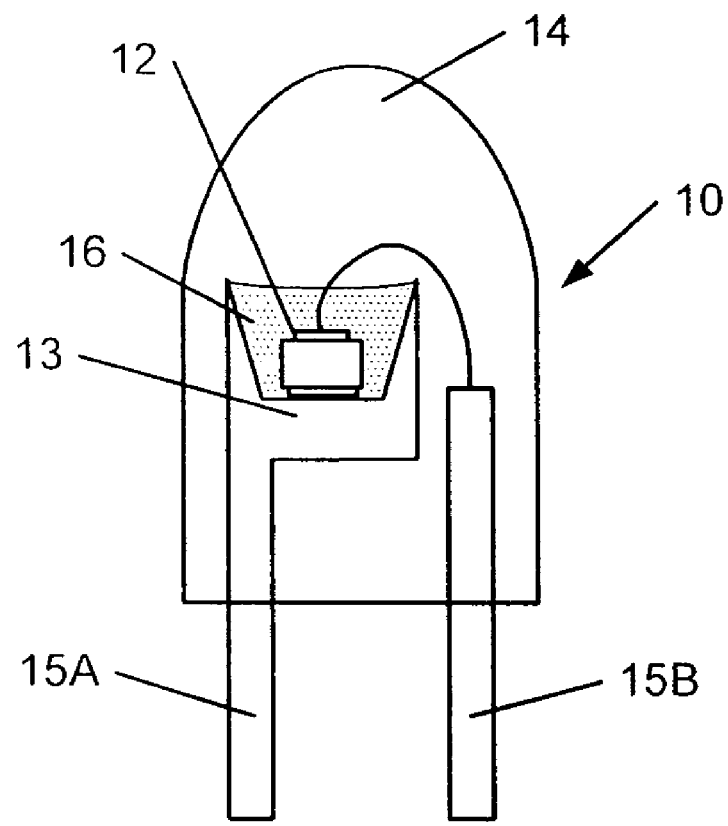
FIGS. 1A and 1B are cross-sectional side views illustrating conventional light emitting device packages.
Figure 1B:
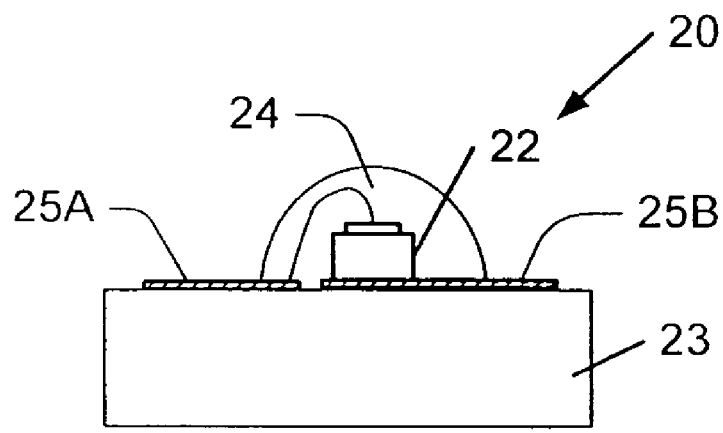

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms Such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items. As used herein, the common abbreviation "e.g.", which derives from the Latin phrase "exempli gratia," may be used to introduce or specify a general example or examples of a previously mentioned item, and is not intended to be limiting of such item. If used herein, the common abbreviation "i.e.", which derives from the Latin phrase "id est," may be used to specify a particular item from a more general recitation.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments of the present invention for packaging a semiconductor light emitting device will be described herein. As used herein, the term semiconductor light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Figure 2A:
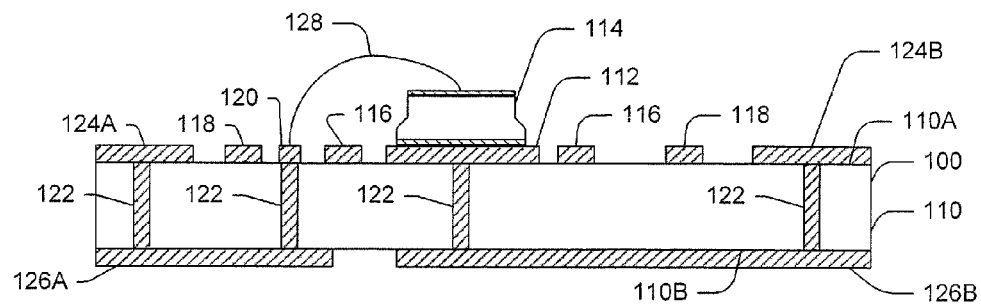
FIG. 2A is a cross-sectional view illustrating a light emitting device submount according to some embodiments of the invention.
Figure 2B:
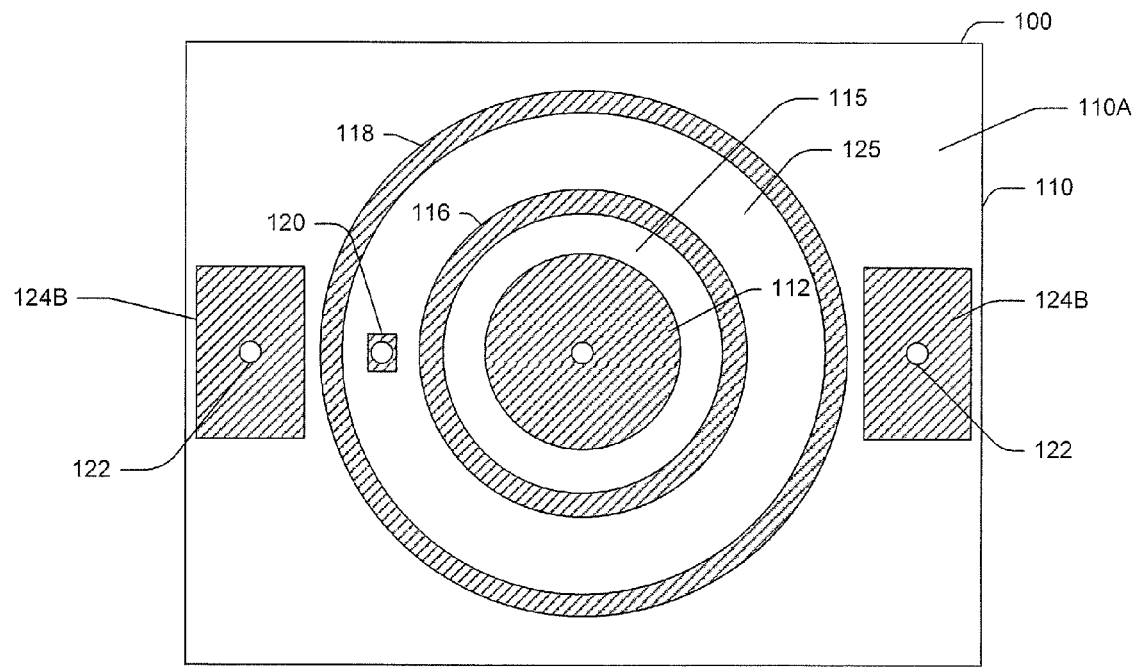
FIG. 2B is a top view illustrating the light emitting device submount of FIG. 2A.
Figure 2C:
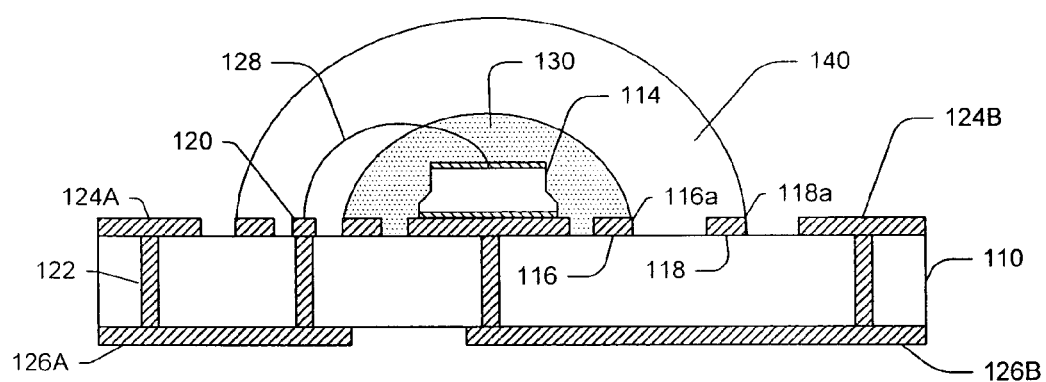
FIG. 2C is a cross sectional view illustrating a light emitting device package according to some embodiments of the invention utilizing the submount of FIG. 2A.

Referring to the embodiments of FIGS. 2A-2C, a submount 100 for mounting an LED chip 114 is illustrated. A submount 100 includes a substrate 110 having an upper surface 110A and a lower surface 110B. The substrate 110 may include a printed circuit board (PCB), an aluminum block, an alumina, aluminum nitride or silicon wafer, or any other suitable substrate material, such as T-Clad thermal clad insulated substrate material, available from The Bergquist Company of Chanhassen, Minn.

As illustrated in FIGS. 2A-2C, a plurality of patterned metal features are formed on the upper surface 110A of the substrate 110. The patterned metal features may include, for example, a die attach pad 112, a wire bond pad 120, a first meniscus control feature 116, a second meniscus control feature 118, and/or electrodes 124. The conductive features on the top surface 110A of substrate 110 may be formed, for example, using a plating process. A plating process may be used to plate a thin or thick metallic film on a substrate. In a typical plating process, a titanium adhesion layer and a copper seed are sequentially sputtered onto a substrate. Then, approximately 75 microns of copper are plated onto the copper seed. Thus, a plating process may be utilized to form a metal film having a characteristic structure. A deposited metal film may be patterned using standard lithographic processes to produce metal films on the substrate having desired patters. Alternatively, the adhesion layer and seed may be sputtered using, for example, a metal mask to form a desired pattern. A plating process may also be used to form conductive metal vias through a substrate.

In some embodiments of the invention, the first and second meniscus control features 116, 118 maybe formed of a material different from the die attach pad 112 and/or the wirebond pad 120. For example, the meniscus control features 116, 118, 210 may comprise a polymer such as a solder mask material including for example polyimide. In particular, a polymer such as polyimide may provide a suitable material for use as a meniscus control feature since polyimide may have a high surface energy, which may provide better meniscus control properties.

The conductive vias may provide electrical contact between features formed on opposite sides of a substrate. Accordingly, respective conductive features formed on the upper surface of substrate 110 may be formed of the same material. For example, the conductive features may include copper deposited using a plating process. However, in some embodiments, some features may include additional metals. For example, the die attach pad 112 may be plated and/or coated with additional metals and/or other materials to make the die attach pad 112 more suitable for mounting an LED chip 114. For example, the die attach pad 112 may be plated with additional layers such as, for example, additional adhesive, bonding, reflector and/or barrier layers (not shown).

As illustrated in the embodiments of FIG. 2B, the die attach pad 112 may be generally centrally located on the upper surface 110A of the substrate 110. The die attach pad 112 may be generally circular in shape, or may have any other desired shape. As further shown in FIG. 2B, the first meniscus control feature 116 formed on the substrate 110 surrounds the die attach pad 112 and defines a first encapsulant region 115 on the upper surface 110A of the substrate 110 within the periphery of the first meniscus control feature 116. The second meniscus control feature 118 surrounds the first encapsulant region 115 and defines a second encapsulant region 125 on the upper surface 110A of the substrate 110 within the periphery of the second meniscus control feature 118. As illustrated in FIG. 2B, the second encapsulant region 125 may enclose and encompass the first encapsulant region 115.

The wirebond pad 120 may be formed on the upper surface 110A of substrate 110 within the first encapsulant region 115 and/or within the second encapsulant region 125. One or more of the electrodes 124 may also be formed on the upper surface 110A of the substrate 110. In addition, one or more lower electrodes 126 may be formed on a lower surface 110B of the substrate 110 as shown in FIG. 2A.

One or more conductive vias 122 may connect one or more of the lower electrodes 126A, 126B to various features on the upper surface 110A of the substrate 110. For example, one of the conductive vias 122 may electrically connect the electrodes 124A, 124B with respective lower electrodes 126A, 126B. Likewise, one of the conductive vias 122 may electrically connect the wire bond pad 120 with the lower electrode 126A, and/or one of the conductive vias 122 may electrically connect the die attach pad 112 with the lower electrode 126B.

As illustrated in the embodiments of FIG. 2C, an LED chip 114 mounted on the die attach pad 112 may be covered with an encapsulant material 130. The encapsulant material 130 may be dispensed onto the upper surface 110A of the substrate 110 using, for example, an automated dispense system, as described more fully below. The encapsulant material 130 may include a liquid silicone, an epoxy resin, and/or another suitable optical encapsulant material. The encapsulant material 130 may include a wavelength conversion material, such as a phosphor and/or a nanocrystal, therein to convert a wavelength of light emitted by the LED chip 114 to a second wavelength.

As illustrated in FIG. 2C, the first encapsulant material 130 is dispensed within the first encapsulant region 115 defined by the first meniscus control feature 116. When the first encapsulant material 130 is dispensed within the first encapsulant region 115, it may form a liquid meniscus (i.e. a curved bubble or dome) over the LED chip 114. Surface tension in the liquid encapsulant material 130 may cause it to cling to the first meniscus control feature 116. For example, the liquid encapsulant material 130 may cling to a corner 116*a* of the first meniscus control feature 116 and/or a surface of the first meniscus control feature 116. For example, as illustrated in FIG. 2C, the encapsulant material 130 may cling to a corner 116*a* of the meniscus control feature 116 that is farthest from the center of the dome of the encapsulant material 130. The dispensed first encapsulant material 130 may be cured, for example, by heating at an appropriate temperature for an appropriate time, to cause the first encapsulant material to harden over the LED chip 114. It will be appreciated that a cure step may include a full and/or partial curing of an encapsulant material. A full cure may cause the liquid encapsulant material to harden completely, while a partial cure may cause the liquid encapsulant to only partially harden. For example, it may be desirable to partially cure a dispensed liquid encapsulant sufficient to permit a subsequent dispense and/or other process steps to be performed. A full cure may be performed after some or all subsequent dispenses have been performed. Alternatively, it may be desirable to perform a full cure after each dispense step.

As further illustrated in FIG. 2C, a wirebond connection 128 may be formed between the LED chip 114 and the wire bond pad 120. The wirebond connection 128 may be made before dispense of the first encapsulant material 130, so that when it is cured, the first encapsulant material 130 may harden around the wirebond connection 128.

After the first encapsulant material 130 has been cured, a second encapsulant material 140 may be dispensed within the second encapsulant region 125 of the upper surface 110A of the substrate 110, i.e. over the cured first encapsulant material 130. The second encapsulant material 140 may form a meniscus dome over the second encapsulant region 125. As with the first encapsulant material 130, the second encapsulant material 140 may cling to a corner 118*a* or a surface of the second meniscus control feature 118 due, for example, to surface tension in the encapsulant material 140. The second encapsulant material 140 may include a clear silicone gel, an epoxy resin, and/or any other optically clear encapsulant material. The dispensed second encapsulant material 140 may be cured, for example, by heating the encapsulant material to a suitable temperature for a suitable time period, to cause the second encapsulant material 140 to harden. The second encapsulant material 140 may accordingly form an optically transparent lens over the cured first encapsulant material 130 and the LED chip 114.

An LED chip 114 packaged in accordance with some embodiments of the invention may approximate an ideal point source of light. Thus, the design of secondary optics (not shown) for the packaged LED may be simplified. In addition, light output of the packaged LED may be improved as optical losses associated with mounting an LED chip inside a reflector cup may be avoided when an LED chip 114 is packaged in accordance with some embodiments of the invention.

Figure 3A:
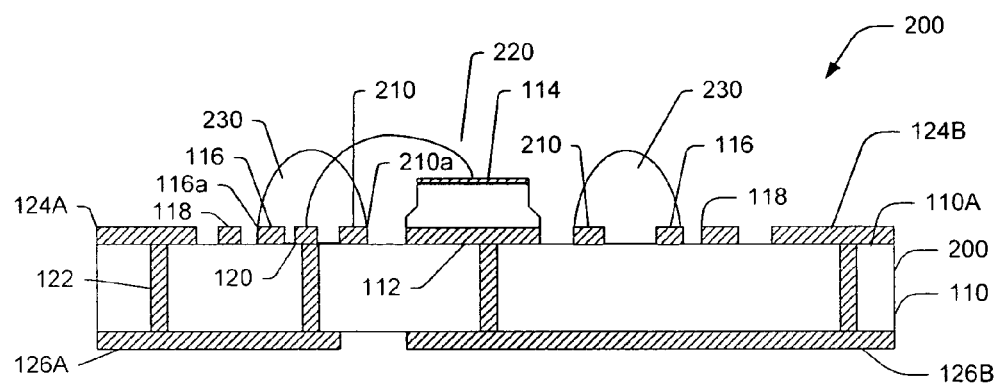
FIG. 3A is a cross-sectional view illustrating a light emitting device submount according to further embodiments of the invention.

Referring to FIGS. 3A-3D further embodiments according to the invention are illustrated. As illustrated in FIG. 3A, a submount 200 for mounting an LED chip 114 includes a substrate 110 having an upper surface 110A and a lower surface 110B. A plurality of metal features are formed on the upper surface 110A of the substrate 110, for example, by a plating process. For example, as with the embodiment illustrated in FIGS. 2A-2C, the submount 200 may include a die attach pad 112, a wire bond pad 120, a first meniscus control feature 116 defining a first encapsulant region 115, and a second meniscus control feature 118 defining a second encapsulant region 125. In addition, embodiments of the invention may further include a third meniscus control feature 210 formed within the first encapsulant region 115 surrounding the die attach pad 112 and defining a third encapsulant region 215. In addition, the first meniscus control feature 116 and the third meniscus control feature 210 define a region 225 within the first encapsulant region 115 surrounding the third encapsulant region 215. As noted above, the meniscus control features 116, 118, 210 may include a material different from the die attach pad 112 and the wirebond pad 120. For example, the meniscus control features 116, 118, 210 may include a polymer such as polyimide.

Figure 3B:
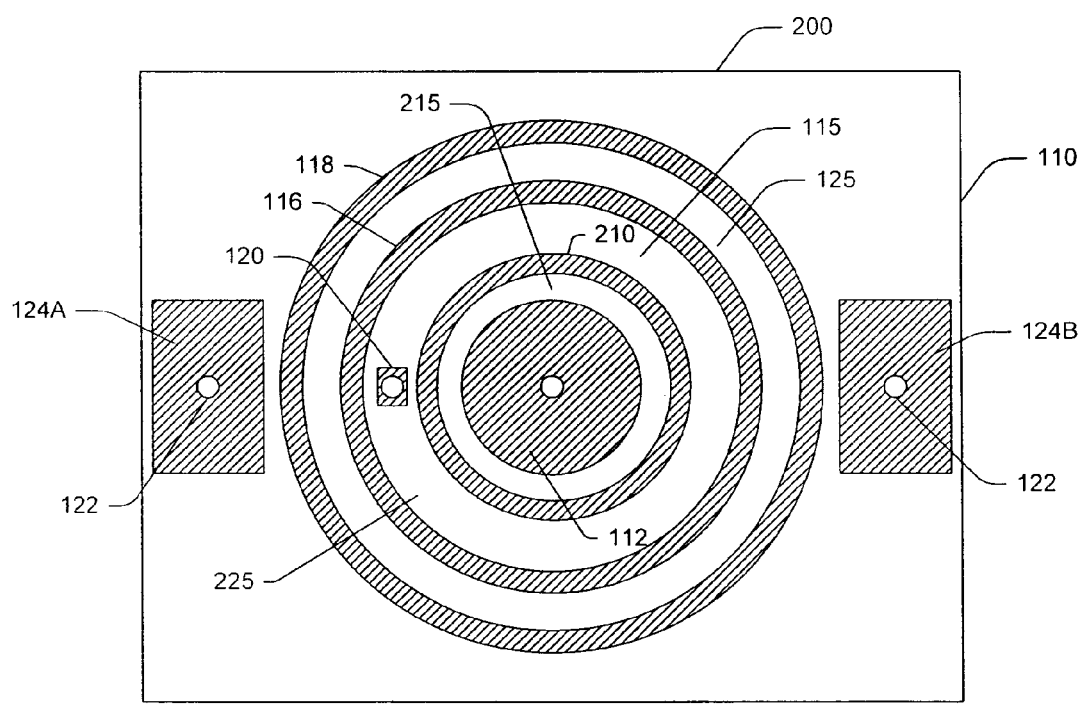
FIG. 3B is a top view illustrating the light emitting device submount of FIG. 3A.

As illustrated in FIG. 3B, the first meniscus control feature 116, second meniscus control feature 118 and third meniscus control feature 210 may be generally circular in shape. Accordingly, the region 225 defined between the first meniscus control feature 116 and the third meniscus control feature 210 may be generally annular or ring-shaped. An encapsulant material may be deposited in an annular region 225 in for example, a circular pattern, by moving a dispensing needle in a circular motion as discussed in more detail below. In this manner, the desired pattern may be "drawn" onto the substrate with the needle.

Other shapes may be possible for the first, second and third meniscus control features 116, 118, 210. For example, the meniscus control features could be generally oval and/or rectangular in shape. In some embodiments, the meniscus control features may be continuous features formed on the upper surface 110A of the substrate 110. If the meniscus control features are not continuous features, encapsulant material dispensed within regions defined by the meniscus control features may be more likely to fail to be confined within a desired region.

As illustrated in FIG. 3A, a first encapsulant material 230 may be dispensed within the region 225 defined by the first meniscus control feature 116 and the third meniscus control feature 210. As illustrated in FIG. 3A, the first encapsulant material 230 may cling to a corner 116*a* of the first meniscus control feature 116 and a corner 210*a* of the third meniscus control feature 210 that are distant from the center of region 225. That is, when it is dispensed, the encapsulant material 230 may flow outward until it reaches an outer corner of the respective first and third meniscus control features 116, 210 where it may be held in place, for example, by surface tension. The dispensed first encapsulant material 230 may be cured, for example, by heating the encapsulant material for a suitable period of time at a suitable temperature, by allowing the dispensed encapsulant to sit for a suitable period of time at room temperature, by exposure to UV light, and/or with the aid of a catalyst. The cured first encapsulant material 230 may thereby form a hardened ring surrounding the third encapsulant region 215 including the die attach pad 112 and the LED chip 114 mounted thereon. In some embodiments, the first encapsulant material 230 may define a cavity 220 surrounding the LED chip 114. The height of the first encapsulant material 230 may be greater than, equal to, or less than the height of the mounted LED chip 114 on the die attach pad 112.

Figure 3C:
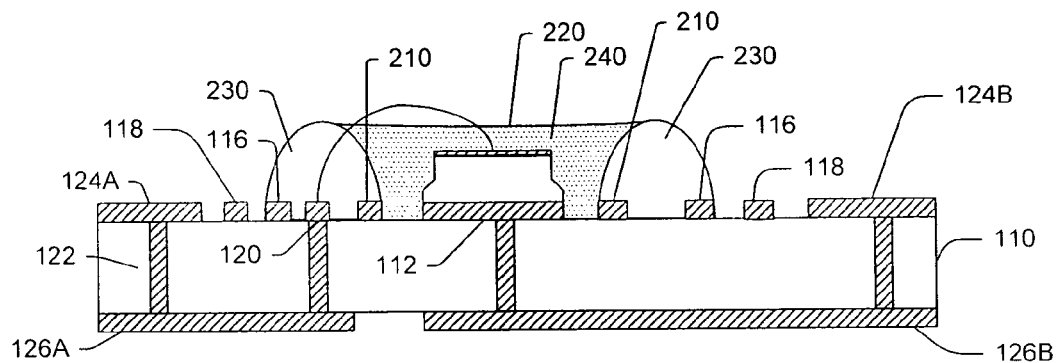
FIG. 3C is a cross sectional view illustrating methods of forming a light emitting device package according to some embodiments of the invention utilizing the submount of FIG. 3A.
Figure 3D:
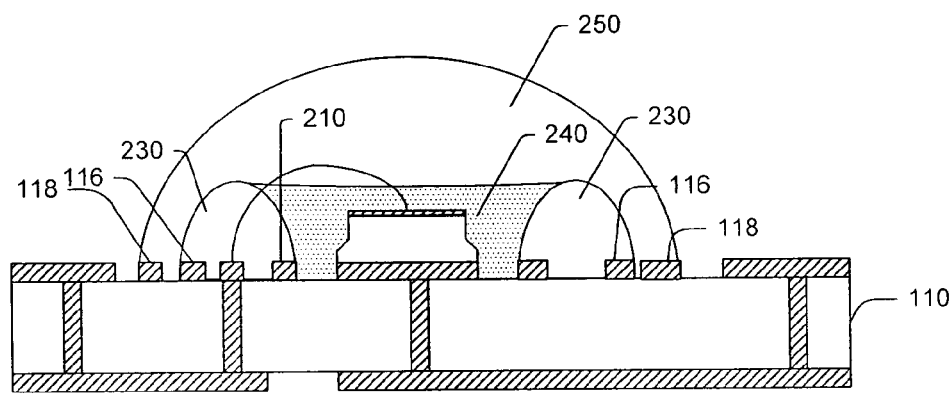
FIG. 3D is a cross sectional view illustrating a light emitting device package according to some embodiments of the invention utilizing the submount of FIG. 3A.

As illustrated in FIG. 3C, a second encapsulant material 240 may be dispensed into the cavity 220 defined by the first encapsulant material 230. In some embodiments, the second encapsulant material 240 may include a wavelength conversion material, such as a phosphor and/or nanocrystal. The dispensed second encapsulant material 240 may be cured in the manner described above. Next, as illustrated in FIG. 3D, a third encapsulant material 250 may be dispensed within the second encapsulant region 125 (i.e. over the first encapsulant material 230 and the second encapsulant material 240). The third encapsulant material 250 may form a domed meniscus lens above the LED chip 114, the first encapsulant material 230 and the second encapsulant material 240. The dispensed third encapsulant material 250 may be cured as described above.

Figure 4A:
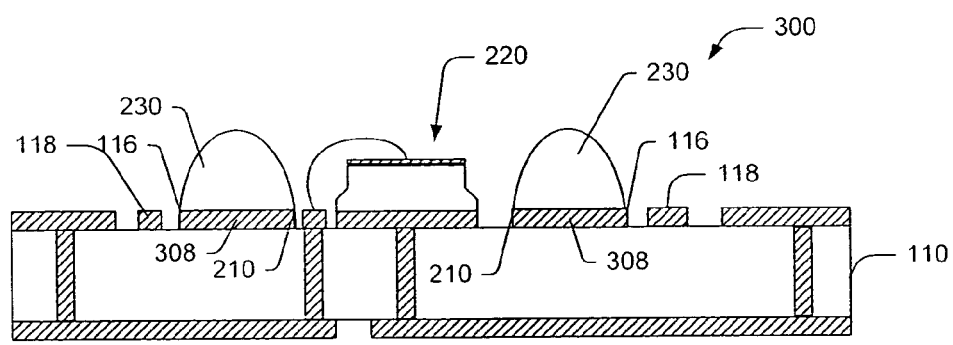
FIGS. 4A-4D are cross sectional views illustrating methods of forming a light emitting device package according to some embodiments of the invention.
Figure 4B:
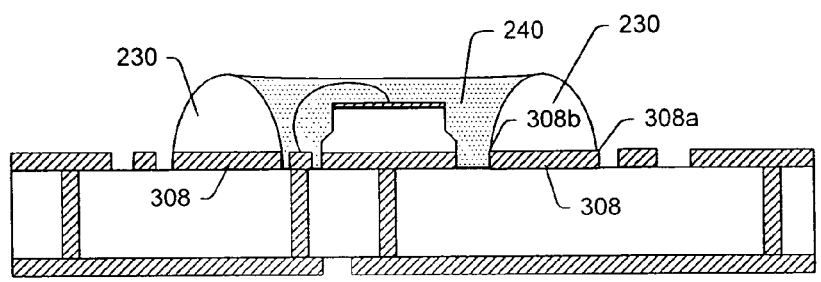
Figure 4C:
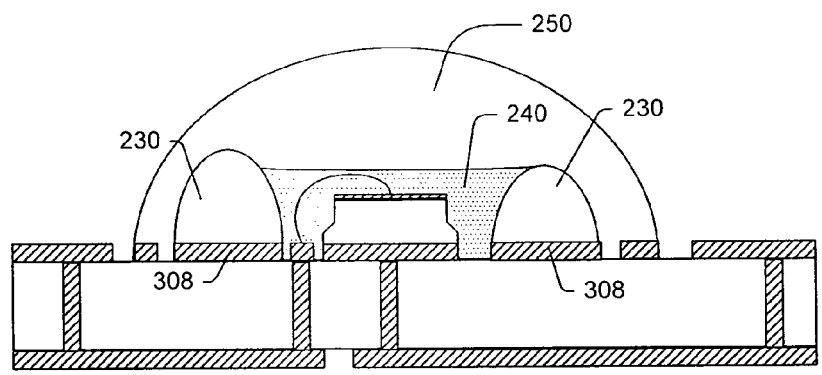
Figure 4D:
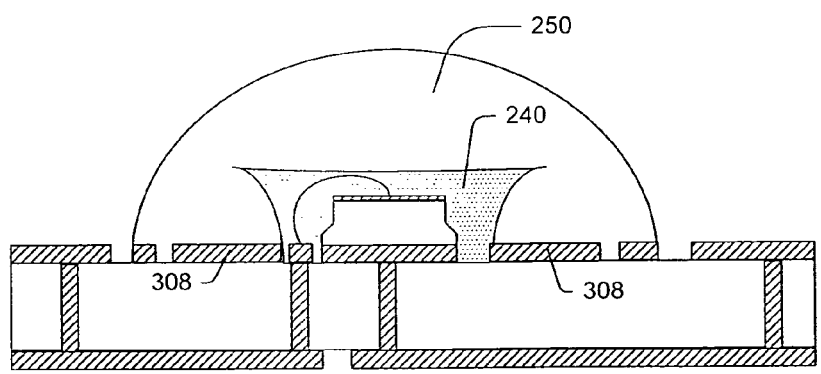

Further embodiments of the invention are illustrated in FIGS. 4A-4C. In the embodiments of FIGS. 4A-4D, a single patterned surface feature 308 provides the first meniscus control feature 116 at a first corner 308a of the feature 308 and the third meniscus control feature 210 at the opposite corner 308b of the feature 308. The first corner of the feature 308 may correspond to an outer circumference of a generally ring shaped feature. The second corner of the feature 308 may correspond to an inner circumference of the feature 308. The first encapsulant material 230 may be dispensed by dispensing an encapsulant material above the feature 308. The encapsulant material 230 may flow outward on the feature 308 and cling to the inner and outer peripheral edges of the feature 308 (i.e., the first meniscus control feature 116 and the third meniscus control feature 210, respectively). As shown in FIG. 4B, the second encapsulant material 240 may be dispensed within the cavity 220 defined by first encapsulant material 230. The third encapsulant material 250 may be dispensed within the second encapsulant region 125 to form a dome-shaped meniscus lens above the LED chip 114.

Figure 5:
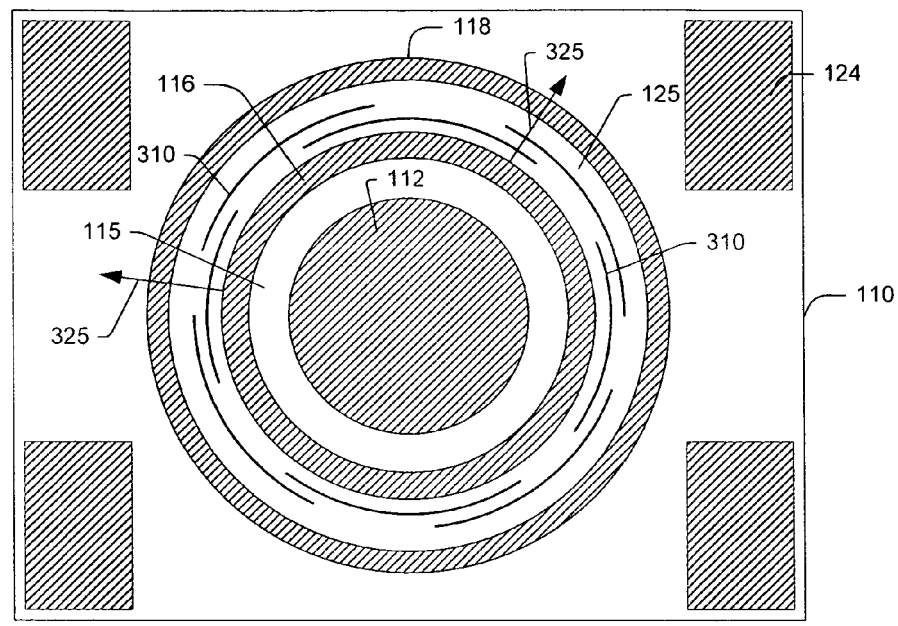
FIG. 5 is a top view illustrating a light emitting device submount according to further embodiments of the invention.

As illustrated in FIG. 5, some embodiments according to the invention may include one or more surface features 310 formed on the upper surface 110A of substrate 110 between the first meniscus control feature 116 and the second meniscus control feature 118. The surface features 310 may include a plurality of patterned features arranged to overlap one another such that an arbitrary path 325 extending in a radial direction from the first meniscus control feature 116 to the second meniscus control feature 118 is interrupted by at least one surface feature 310. The surface features 310 may perform a number of functions. First, the surface features 310 may provide a patterned feature on the upper surface 110A of the substrate 110 to which an encapsulant material dispensed over the surface may grip, which may provide a better, more mechanically robust connection between the encapsulant material and the upper surface 110A of the substrate 110. In addition, the surface features 310 may slow the flow of liquid encapsulant material across the surface of the region in which the surface features 310 are formed so that, for example, the liquid encapsulant material may be more likely to cling to a meniscus control feature as desired. For example, when an encapsulant material is dispensed within the second encapsulant region 125, if the material flows too quickly within region 125, it may flow over the meniscus control feature 118 and out of the second encapsulant region 125. However, when the flow of the second encapsulant material 140 is limited by the surface features 310, the encapsulant material may more reliably cling to the second meniscus control feature 118. The surface features 310 are illustrated between the first meniscus control feature 116 and the second meniscus control feature 118 in FIG. 5. However, it will be understood by those skilled in the art that the surface features 310 could be formed in any region of the upper surface 110A on which encapsulant material is to be dispensed Moreover, it will be understood that while the surface features 310 are illustrated as being discontinuous, the surface features 310 could be continuous provided they are small enough or formed with an appropriate shape and/or thickness such that encapsulant material will not undesirably cling to an edge or surface of the surface feature 310.

Figure 6A:
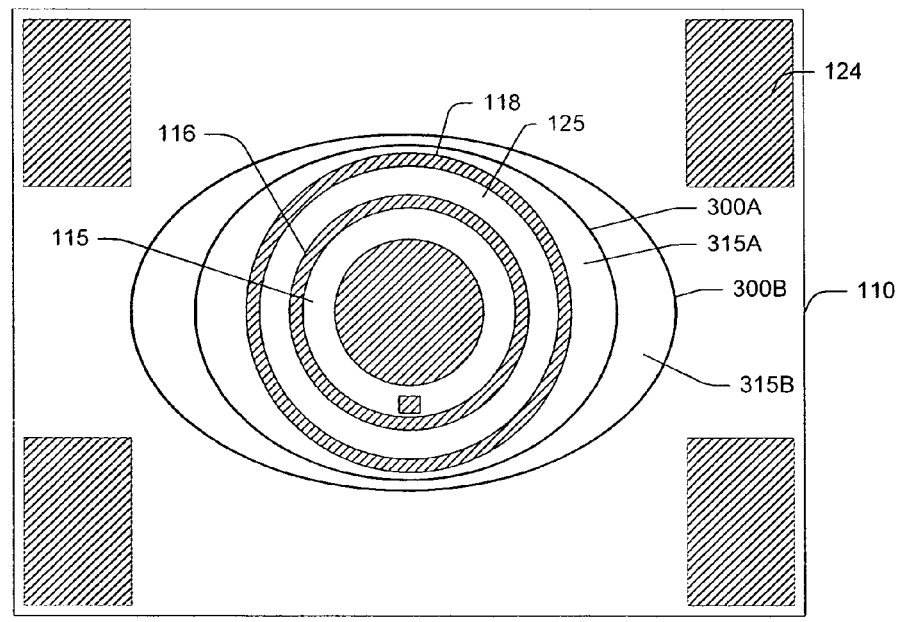
FIG. 6A is a top view illustrating a light emitting device submount according to further embodiments of the invention.
Figure 6B:
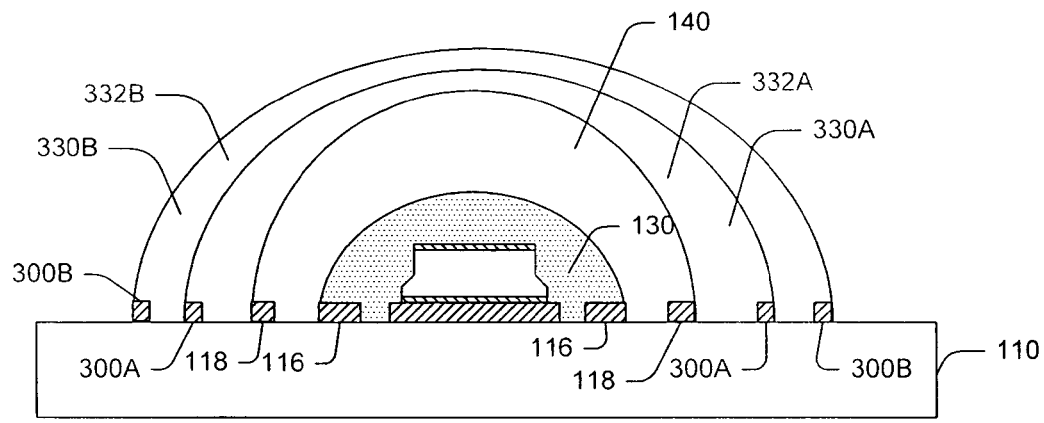
FIG. 6B is a cross sectional view illustrating a light emitting device package according to some embodiments of the invention utilizing the submount of FIG. 6A.
Figure 6C:
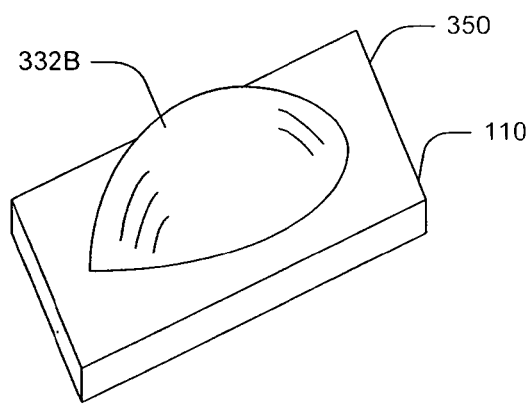
FIG. 6C is a perspective view of a light emitting device package according to some embodiments of the invention utilizing the submount of FIG. 6A.

Referring now to FIGS. 6A-6C, further embodiments according to the invention are illustrated. As shown in FIG. 6A, one or more meniscus extension features 300A, 300B may be formed on the upper surface 110A of substrate 110 outside the second meniscus control feature 118. As illustrated in FIG. 6A, the meniscus extension features 300A, 300B may have peripheral geometries different from the peripheral geometry of the second meniscus control feature 118. In the embodiment illustrated in FIG. 6A, the second meniscus control feature 118 has a generally circular shape, while the meniscus extension features 300A, 300B have generally elliptical shapes with sequentially increasing axis lengths and eccentricities (i.e. increasing ratios of major axis length to minor axis length). After deposition and curing of the second encapsulant material 140, the shape of the lens formed by the second encapsulant material 140 may be modified by dispensing additional encapsulant material within the regions defined by the encapsulant extension features 300A and 300B. Thus, the ultimate shape of the lens covering the LED chip 114 may be determined by the shape of the encapsulant extension features 300A, 300B, as well as the number of dispense/cure steps employed. Multiple encapsulant extension features 300A, 300B may be employed to gradually increase the size and/or change the shape of the lens while limiting the amount of encapsulant material that needs to be dispensed in any given dispense/cure cycle. Although two encapsulant extension features 300A, 300B are illustrated in FIGS. 6A-6C, it will be appreciated that more or less encapsulant extension features may be provided. The surface features 310 and/or the meniscus extension features 300A, 300B may include patterned metal films that may be formed concurrently with the formation of the die attach pad 112. In some embodiments of the invention, the surface features 310 and/or the meniscus extension features 300A, 300B may include a different material such as a polymer such as polyimide.

As illustrated in FIG. 6B, after deposition and curing of the second encapsulant material 140, a quantity of encapsulant material 330A may be dispensed within the region 315A bounded by the encapsulant extension feature 300A. The encapsulant material 330A may be cured to form a hardened dome 332A having a different peripheral shape than the dome formed by the second encapsulant material 140. If desired, a second quantity of the encapsulant material 330B may be dispensed within the region 315B defined by the encapsulant extension feature 300B. The dispensed encapsulant material 330B may be cured to form a hardened lens 332B over the LED chip 114 having a different peripheral shape than second encapsulant material 140 or the dome 332A. This process may be repeated as desired until a desired shape of meniscus lens is formed above the LED chip 114.

FIG. 6C is a perspective view of a resulting LED package 350. including a substrate 110 on which is formed a hardened dome lens 332A.

Figure 7:
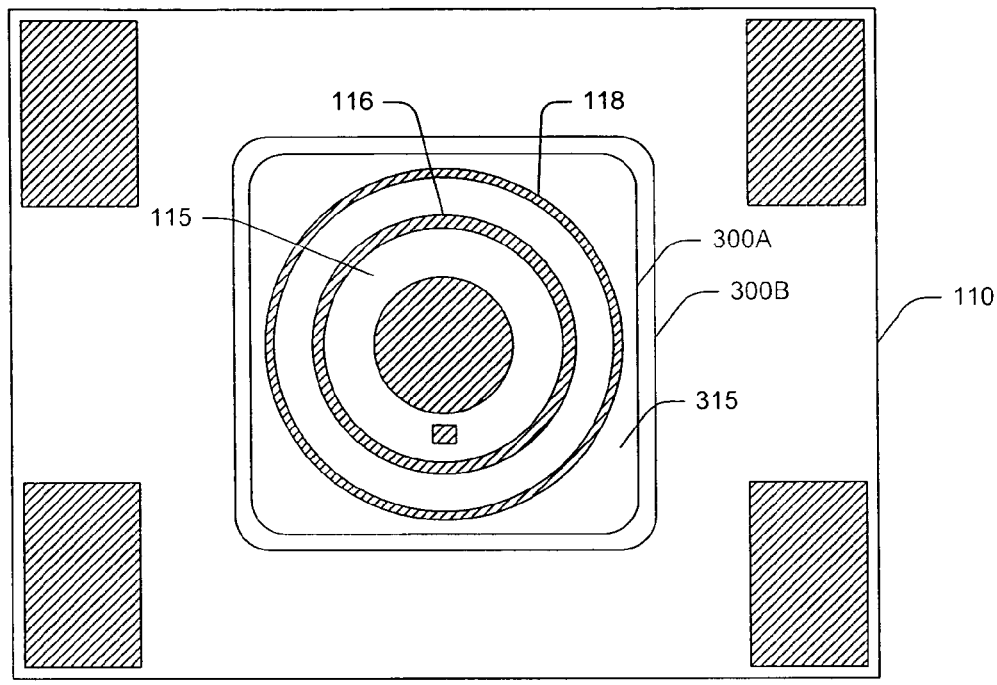
FIG. 7 is a top view illustrating a light emitting device submount according to further embodiments of the invention.

As shown in FIG. 7, the encapsulant extension regions may have shapes other than circular or oval. In particular, the encapsulant extension features 300A, 300B may have peripheral shapes that are generally square and/or rectangular. Other shapes are possible and may be used to produce different shaped lenses as desired.

The ability to deliver small volumes of fluids accurately may be important in the manufacture of packaged LEDs according to the invention. A variety of different fabrication operations in the semiconductor industry utilize sub-microliter control of fluid dispensing. Such uses may utilize accurate, repeatable and rapid dispensing of precise amounts of fluids. Inaccurate dispensing may adversely impact the yield of a fabrication process.

As discussed above, after the light-emitting device 114 is mounted on the substrate 110, a microliter quantity of an encapsulant material, such as liquid silicone gel, is dispensed into one or more encapsulant regions. In dispensing the encapsulant material, a bead of the material is typically formed on a dispensing needle and then contacted to surfaces of the substrate 110 and/or the light-emitting device 114. When the needle is withdrawn, the surface tension between the encapsulant material and surfaces on the substrate 110 and gravity may cause the encapsulant material to tear-off from the dispensing needle and remain on the substrate 110. In some embodiments, the encapsulant material may be dispensed in a desired pattern, for example, a circular pattern, by moving the needle in a circular motion after contacting the bead to the surface of the substrate. In this manner, the desired pattern may be "drawn" onto the substrate with the needle.

Figure 8:
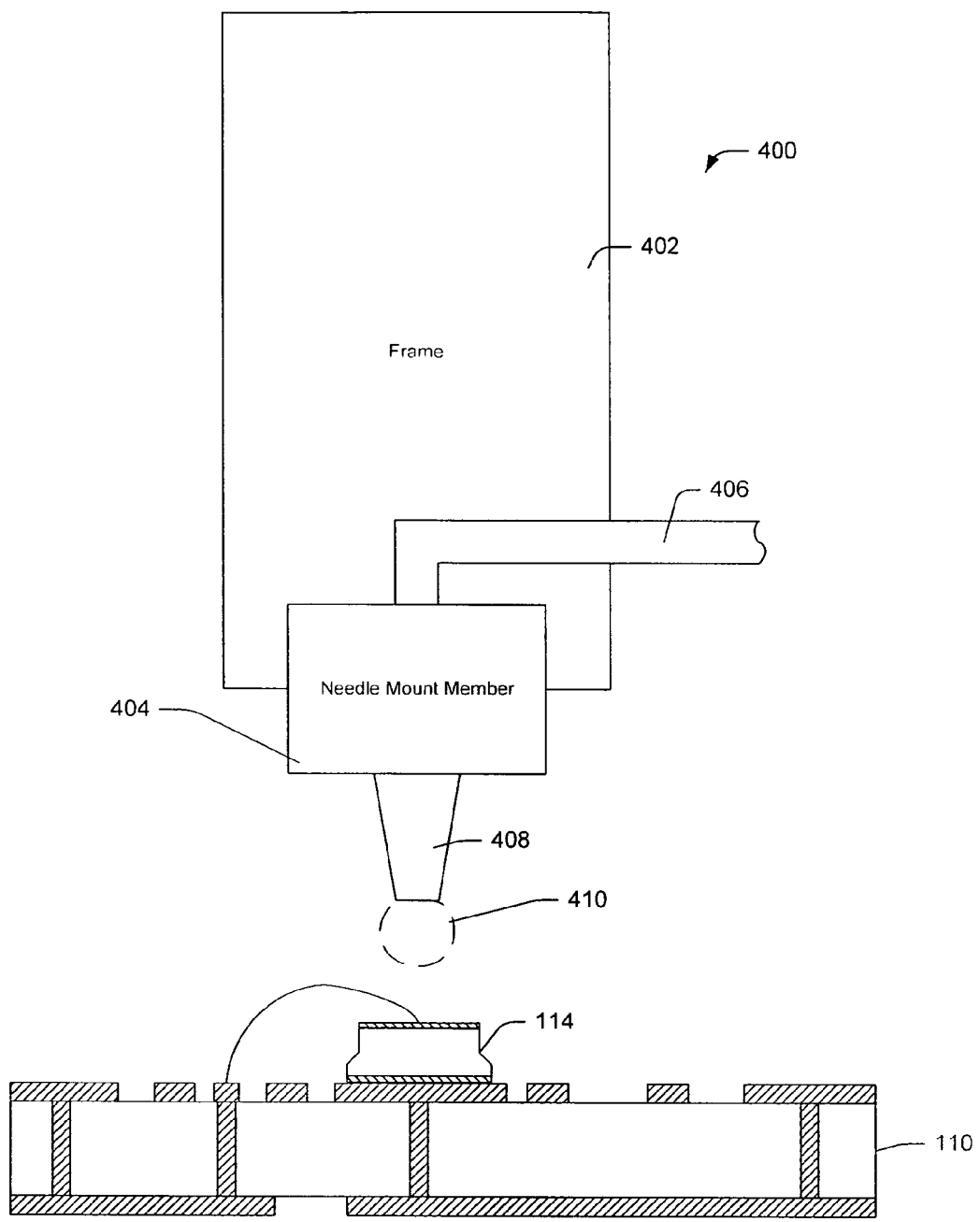
FIG. 8 is a schematic illustration of a system for dispensing an encapsulant material for use in packaging a light emitting device according to some embodiments of the invention.

A system 400 for dispensing an encapsulant material for use in packaging a light emitting device according to some embodiments of the invention is illustrated in FIG. 8. The system 400 includes a frame 402, which may be attached to an articulated arm (not shown) configured to controllably move the frame 402 in the X, Y, and Z dimensions. A needle mount member 404 is mounted on the frame 402, and an encapsulant supply line 406 is coupled to the needle mount member 404 for supplying a quantity of encapsulant material to a hollow dispensing needle 408 mounted on the needle mount member 404. A bead of encapsulant 410 may be formed at the tip of the dispensing needle 408. As discussed above, the bead of encapsulant 410 may be dispensed onto the substrate 110 and/or the LED chip 114 by contacting the bead 410 to a surface of the substrate 110 and/or the LED chip 114. Moreover, the shape of the dispensed encapsulant may be controlled by moving the frame 402 in the X and Y dimensions as the encapsulant is being dispensed. For example, the encapsulant may be effectively dispensed into an annular region by moving the frame in a circular pattern after contacting the bead 410 to a surface of the substrate 110 within the annular region.

The viscosity and/or other properties of the material used for a dispense may be selected such that, for example, wetting occurs without bubble formation. In further embodiments of the present invention, coatings may be applied to surfaces contacted by the dispensed material to speed/retard the wetting rate. For example, using certain known cleaning procedures that leave microscopic residue, selected surfaces may be treated and, thus, used to engineer the dynamics of the wetting action.

Due to the surface properties of the substrate 110, the LED chip 114 and of the encapsulant material 410, the dispensed encapsulant material may flow in a manner that could cause bubbles to form therein. In particular, the encapsulant material may move or "wick" more rapidly around the sidewalls of the LED chip 114 faster than over the top of the LED chip 114. As a result, a bubble could be trapped on a side of the LED 114 opposite from the side where the encapsulant material is dispensed when the side-flowing encapsulant material meets, and then encapsulant material flows over the top of the LED chip 114. Accordingly, when encapsulant material is dispensed into an encapsulant region including the LED chip 114, such as, for example, the encapsulant region 115 illustrated in FIG. 2B, the encapsulant may be pre-dispensed in a first dispense portion adjacent the LED chip 114 selected to substantially cover the LED chip 114 and a second dispense portion selected to fill the encapsulant region 115. The quantity of the first portion of dispensed encapsulant material may be selected to reduce or prevent the risk of forming bubbles around the LED chip 114. As such, as used herein, reference to "substantially" covering the LED chip 114 refers to covering enough of the structure of the LED chip 114 so that such a bubble will not generally result when the remaining portion of the encapsulant material dispensed. After the initially dispensed portion of encapsulant material is allowed to settle, the second portion of the encapsulant material may be dispensed into the encapsulant region.

Figure 9:
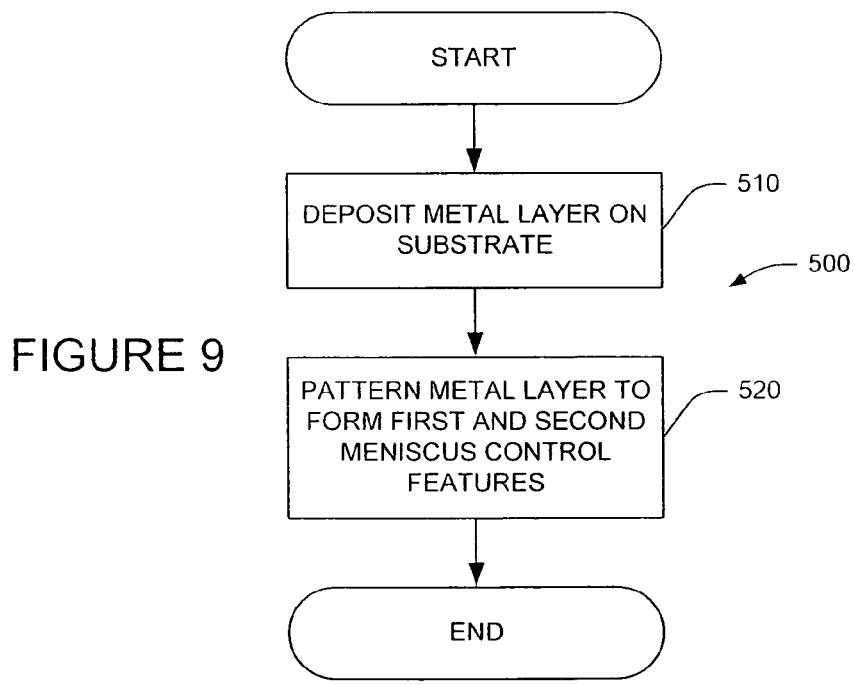
FIGS. 9-11 are flowcharts illustrating methods according to some embodiments of the invention.
Figure 10:
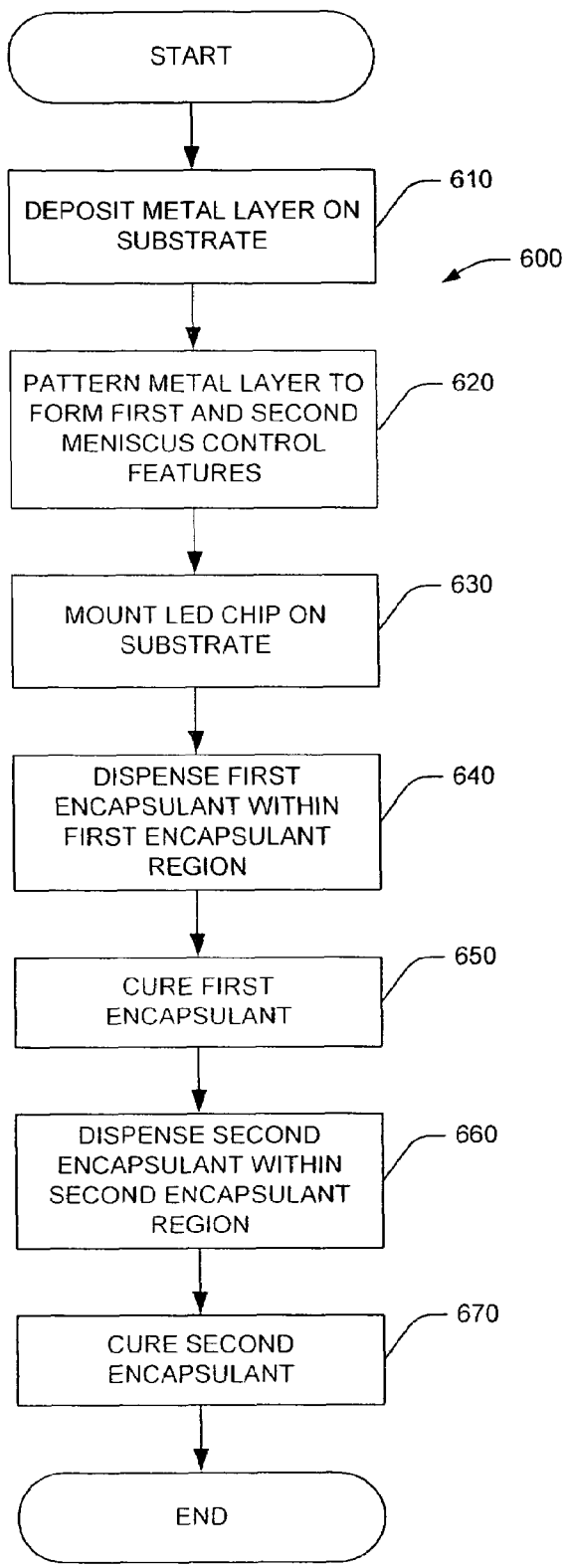
Figure 11:
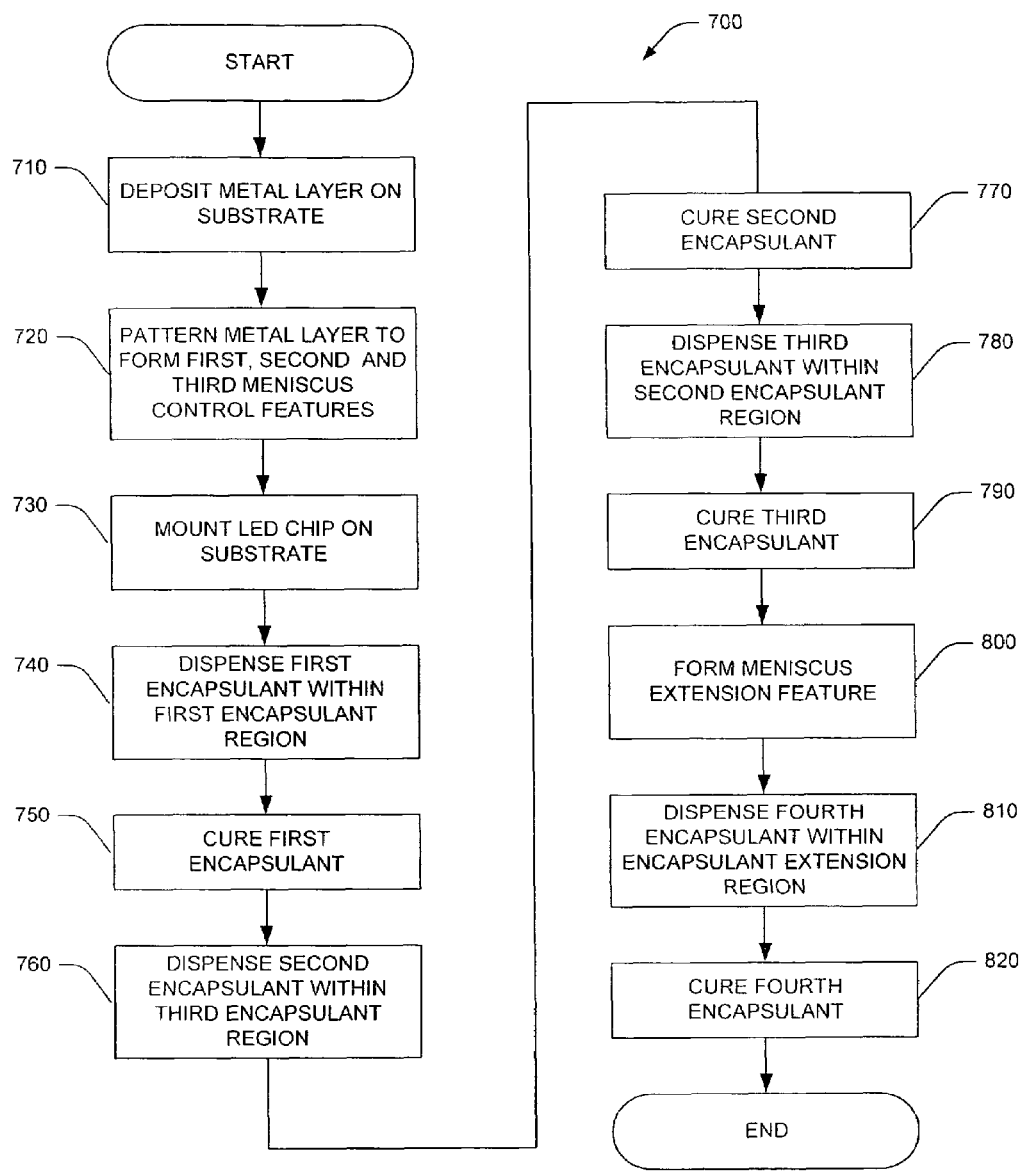

Methods of forming LED submounts and packaged LEDs according to some embodiments of the invention are further illustrated in FIGS. 9-11. The methods illustrated in FIGS. 9-11 are described with reference to the embodiments illustrated in FIGS. 2A-8 above. As illustrated in FIG. 9, some methods 500 of forming an LED submount according to some embodiments of the invention includes depositing a metal layer on a substrate 110 (block 510); and patterning the metal layer to form a die attach pad 112, a first meniscus control feature 116 surrounding the die attach pad 112 and defining a first encapsulant region 115 of the upper surface of the substrate 110, and a second meniscus control feature 118 surrounding the first encapsulant region 115 and defining a second encapsulant region 125 of the upper surface of the substrate 110 (block 520).

Methods of forming a packaged LED according to some embodiments of the invention are illustrated in FIG. 10. As illustrated therein, methods 600 according to some embodiments of the invention may include depositing a metal layer on a substrate 110 (block 610) and patterning the metal layer to form a die attach pad 112, a first meniscus control feature 116, and a second meniscus control feature 118 (block 620). The first meniscus control feature surrounds the die attach pad 112 and defines a first encapsulant region 115 of the upper surface of the substrate 110, and the second meniscus control feature 118 surrounds the first encapsulant region 115 and defines a second encapsulant region 125 of the upper surface of the substrate 110.

The method 600 further includes mounting an LED chip 114 on the die attach pad 112 on the substrate 110 (block 630). A first encapsulant material 130 is then dispensed onto the substrate 110 and the LED chip 114 within the first encapsulant region 115 (block 640), and the first encapsulant material 130 is cured (block 650).

After curing the first encapsulant material, a second encapsulant material 140 is dispensed onto the substrate 110 within the second encapsulant region 125 (block 660), and the second encapsulant material 140 is cured (block 670).

In some embodiments, patterning the metal layer includes patterning the metal layer to form a wirebond pad 120 within the second encapsulant region 125. In some embodiments, the method further includes forming a wirebond connection between the LED chip 114 and the wirebond pad 120.

As discussed above, some embodiments of the invention include pre-dispensing a quantity of encapsulant material adjacent the LED chip 114 prior to dispensing the first encapsulant material 130. Moreover, a sufficient quantity of the first encapsulant material 130 may be pre-dispensed to substantially cover the LED chip 114. In some embodiments, the first encapsulant material 130 includes a wavelength conversion material such as a phosphor or a nanocrystal.

Patterning the metal layer may further include forming at least one surface feature 300 between the first and second meniscus control features 118. As discussed above, the surface features 300 may help the encapsulant material adhere to the surface 110A of the substrate 110 and/or cling to the meniscus control features 116, 118.

Referring now to FIG. 11, further methods 700 of forming a packaged LED according to some embodiments of the invention are illustrated that include depositing a metal layer on a substrate 110 (block 710). The metal layer is patterned to form a die attach pad 112, a first meniscus control feature 116, a second meniscus control feature 118 and a third meniscus control feature 210 (block 720). As discussed above, the first meniscus control feature 116 may surround the die attach pad 112 and define a first encapsulant region 115 of the upper surface of the substrate 110. The second meniscus control feature 118 may surround the first encapsulant region 115 and define a second encapsulant region 125 of the upper surface of the substrate 110. The third meniscus control feature 210 is formed within the first encapsulant region 115 and may surround the die attach pad 112 to thereby define a third encapsulant region 215 within the first encapsulant region 115. The first meniscus control feature 116 and the third meniscus control feature 210 define a region 225 in the first encapsulant region 115 surrounding the third encapsulant region 215. It will be understood that for a feature to "surround" a region, the feature need not be continuously formed around the region. Although the figures illustrate continuous features, it may be possible for a meniscus control feature to include gaps or voids therein which do not affect the meniscus control function of the feature.

The methods 700 may further include mounting an LED chip 114 on the die attach pad 112 (block 730) and dispensing a first encapsulant material 230 within the region 225 in the first encapsulant region 115 defined by the first meniscus control feature 116 and the third meniscus control feature 210 (block 740). The dispensed first encapsulant material 230 is cured (block 750) and a second encapsulant material 240 is dispensed onto the substrate 110 within the third encapsulant region 215 (block 760). The dispensed second encapsulant material 240 may be cured (block 770).

Continuing with the discussion of FIG. 11, the methods 700 may further include dispensing a third encapsulant material 250 within the second encapsulant region 125 (block 780), and curing the third encapsulant material 250 (block 790).

As illustrated above, the dispensed first encapsulant material 230 may define a cavity 220 around the LED chip 114, and dispensing the second encapsulant material 240 may include dispensing the second encapsulant material 240 into the cavity 220 around the LED chip 114 after curing the first encapsulant material 230. The first encapsulant material 230, the second encapsulant material 240 and/or the third encapsulant 230 material may include a wavelength conversion material.

Some methods of the invention include forming a meniscus extension feature 300 outside the second encapsulant region 125 surrounding the second encapsulant region 125 and defining a encapsulant extension area 315 of the upper surface of the substrate 110 (block 800), and dispensing a fourth encapsulant material 330 in the encapsulant extension area 315 after curing the second encapsulant material 140 (block 810) and curing the fourth encapsulant material 330 (block 820).

As discussed above in reference to FIGS. 6A-7, the encapsulant extension area 315 may have a peripheral shape that is different from a peripheral shape of the second encapsulant region 125. For example, the encapsulant extension area 315 may have a peripheral shape that is oval, circular or generally square or rectangular.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A submount for mounting an LED, the submount comprising:

a substrate having a planar upper surface;

a die attach pad on the upper surface of the substrate, the die attach pad configured to receive an LED chip;

a first meniscus control feature on the substrate, the first meniscus control feature comprising a first patterned film on the planar upper surface of the substrate surrounding the die attach pad, defining a first encapsulant region of the upper surface of the substrate, and being configured to limit the flow of a liquid encapsulant material across the substrate, wherein a portion of the planar upper surface of the substrate within the first encapsulant region is exposed; and a second meniscus control feature on the substrate, the second meniscus control feature comprising a second patterned film on the planar upper surface of the substrate surrounding the first encapsulant region, exposing and defining a second encapsulant region of the upper surface of the substrate including an exposed portion of the planar upper surface of the substrate between the first meniscus control feature and the second meniscus control feature, and being configured to limit the flow of a liquid encapsulant material across the substrate.

2. The submount of claim 1, wherein the substrate comprises a printed circuit board (PCB).

3. The submount of claim 1, wherein the die attach pad and the first and second meniscus control features comprise metal traces.

4. The submount of claim 1, wherein the first and/or second meniscus control features comprises a metal film.

5. The submount of claim 1, wherein the die attach pad and the first and second meniscus control features comprise the same material.

6. The submount of claim 5, wherein the first and/or second meniscus control features comprise a plated metal film or a polymer feature.

7. The submount of claim 1, wherein the die attach pad and the first and second meniscus control features are directly on the planar upper surface of the substrate.

8. The submount of claim 1, further comprising a wirebond pad on the planar upper surface of the substrate, the wirebond pad disposed within the second encapsulant region.

9. The submount of claim 1, wherein the substrate comprises a lower surface opposite the upper surface of the substrate, and wherein the submount further comprises an electrode on the lower surface of the substrate.

10. The submount of claim 9, further comprising a conductive via extending through the substrate from the electrode to the die attach pad.

11. The submount of claim 9, further comprising:
a wirebond pad on the substrate, the wirebond pad disposed within the second encapsulant region; and
a conductive via extending through the substrate from the electrode to the wirebond pad.

12. The submount of claim 1, further comprising an electrode on the upper surface of the substrate.

13. The submount of claim 12, wherein the electrode on the upper surface of the substrate and the first and second meniscus control features comprise the same material.

14. The submount of claim 12, wherein the substrate comprises a lower surface opposite the upper surface of the substrate, and the submount further comprises a lower electrode on the lower surface of the substrate and a conductive via extending through the substrate from the lower electrode to the electrode on the upper surface of the substrate.

15. The submount of claim 1, wherein the die attach pad and the first and second meniscus control features comprise metal traces and wherein the die attach pad further comprises a metal stack on the metal trace.

16. A submount for mounting an LED, the submount comprising:
a substrate having a planar upper surface;
a patterned film on the planar upper surface of the substrate, wherein the patterned film comprises:
a portion configured to receive an LED chip;
a first meniscus control feature on the planar upper surface of the substrate defining a first encapsulant region of the upper surface of the substrate and configured to limit the flow of an encapsulant material out of the first encapsulant region; and
a second meniscus control feature on the planar upper surface of the substrate defining a second encapsulant region of the upper surface of the substrate and configured to limit the flow of an encapsulant material out of the second encapsulant region.

17. The submount of claim 16, wherein the patterned film comprises a conductive trace directly on the planar upper surface of the substrate.

18. The submount of claim 16, wherein the patterned film further comprises a wirebond pad disposed within the second encapsulant region.

19. The submount of claim 16, wherein the patterned film further comprises an electrode disposed outside the second encapsulant region.

* * * * *